(12) United States Patent
Nonaka et al.

(10) Patent No.: US 8,105,927 B2
(45) Date of Patent: Jan. 31, 2012

(54) METHOD FOR MANUFACTURING ION IMPLANTATION MASK, AND METHOD FOR MANUFACTURING SILICON CARBIDE SEMICONDUCTOR DEVICE

(75) Inventors: Ken-ichi Nonaka, Wako (JP); Hideki Hashimoto, Wako (JP); Seiichi Yokoyama, Wako (JP); Hiroaki Iwakuro, Hanno (JP); Koichi Nishikawa, Hanno (JP); Masaaki Shimizu, Hanno (JP); Yusuke Fukuda, Hanno (JP)

(73) Assignees: Honda Motor Co., Ltd., Tokyo (JP); Shindengen Electric Manufacturing Co., Ltd., Tokyo (JP)

( * ) Notice: Subject to any disclaimer, the term of this patent is extended or adjusted under 35 U.S.C. 154(b) by 99 days.

(21) Appl. No.: 12/716,916

(22) Filed: Mar. 3, 2010

(65) Prior Publication Data
US 2010/0159653 A1 Jun. 24, 2010

Related U.S. Application Data

(62) Division of application No. 11/496,627, filed on Aug. 1, 2006, now Pat. No. 7,709,862.

(30) Foreign Application Priority Data

Aug. 2, 2005 (JP) ................................ P2005-224353

(51) Int. Cl.
*H01L 21/425* (2006.01)
(52) U.S. Cl. ........ 438/514; 438/680; 438/685; 438/712; 438/931; 257/E21.054; 257/E21.094; 257/E21.17; 257/E21.218; 257/E21.334
(58) Field of Classification Search .................. 438/197, 438/514, 680, 663, 685, 931; 257/E21.17, 257/E21.054, E21.094, E21.218, E21.334
See application file for complete search history.

(56) References Cited

U.S. PATENT DOCUMENTS

| 4,655,875 | A | * | 4/1987 | Wada et al. ............... 438/514 |
| 5,019,519 | A | | 5/1991 | Tanaka et al. |
| 5,539,217 | A | | 7/1996 | Edmond et al. |
| 5,895,939 | A | | 4/1999 | Ueno |
| 6,117,735 | A | | 9/2000 | Ueno |
| 7,323,723 | B2 | | 1/2008 | Ohtsuka et al. |
| 7,709,862 | B2 | * | 5/2010 | Nonaka et al. ............. 257/213 |

FOREIGN PATENT DOCUMENTS

| JP | 1-27222 A | 10/1989 |
| JP | 2004-297007 A | 10/2004 |

OTHER PUBLICATIONS

2002 Report on the Results Commissioned by the new Energy & Industrial Technology Development Organization Developement of Ultralow-Loss Power Devices Technology Element Processing Technology Mar. 2003 Research & Development Association.
Sachdev et al., Tungsten Interconnects in VLSI, 1986 Materials Research Society, vol. 2, No. 2, pp. 161-171.
Sze, "VLSI Technology 2nd ed.", 1998, XP-002484604, pp. 384-385.
Tauber et al., Basics of thin films, 1986, XP-002484605, p. 113.

* cited by examiner

*Primary Examiner* — David Nhu
(74) *Attorney, Agent, or Firm* — Birch, Stewart, Kolasch & Birch, LLP

(57) ABSTRACT

A method for manufacturing an ion implantation mask is disclosed which includes the steps of: forming an oxide film as a protective film over the entire surface of a semiconductor substrate; forming a thin metal film over the oxide film; and forming an ion-inhibiting layer composed of an ion-inhibiting metal over the thin metal film. The obtained ion implantation mask is used to form a deeper selectively electroconductive region.

8 Claims, 13 Drawing Sheets

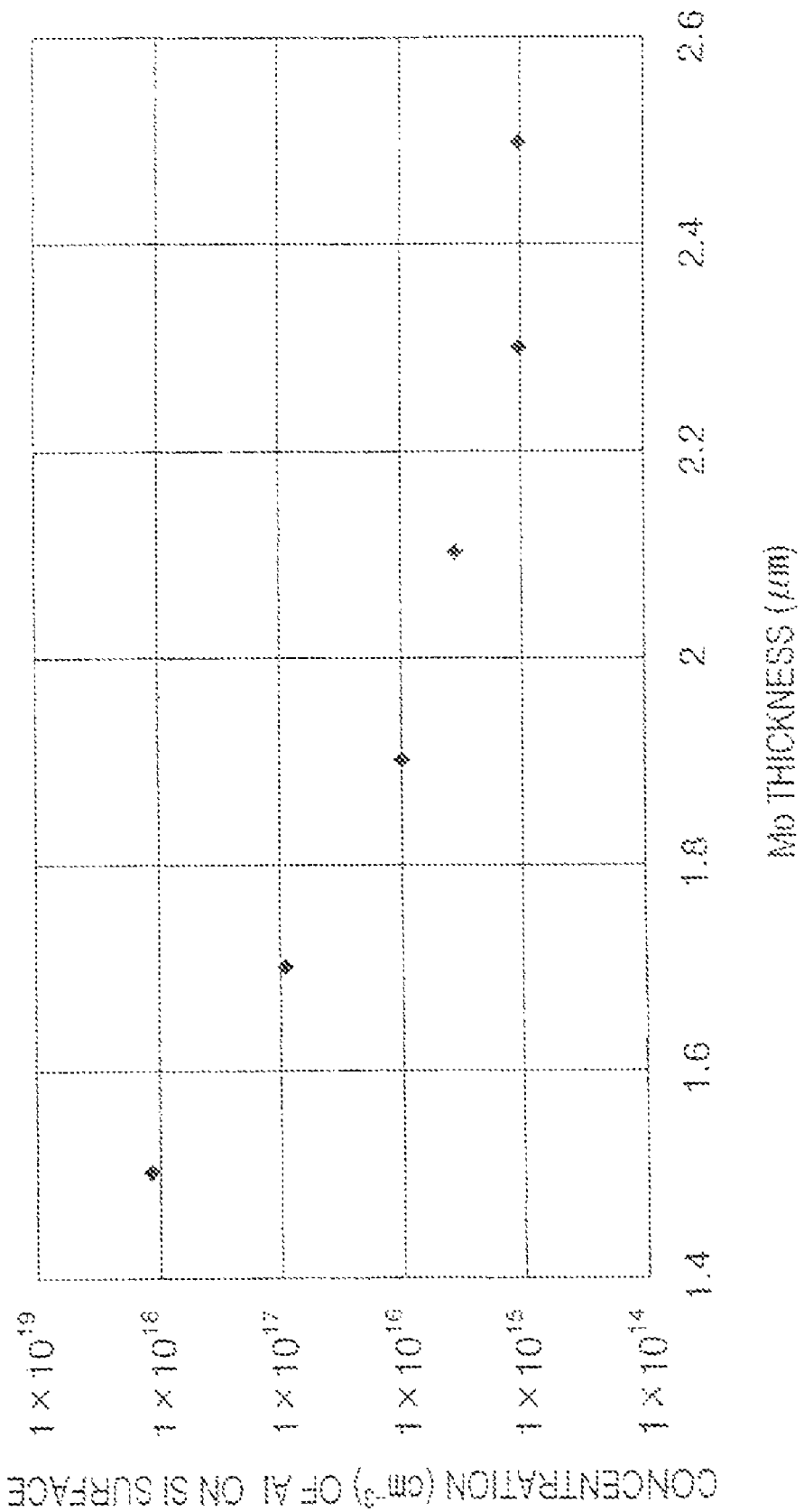

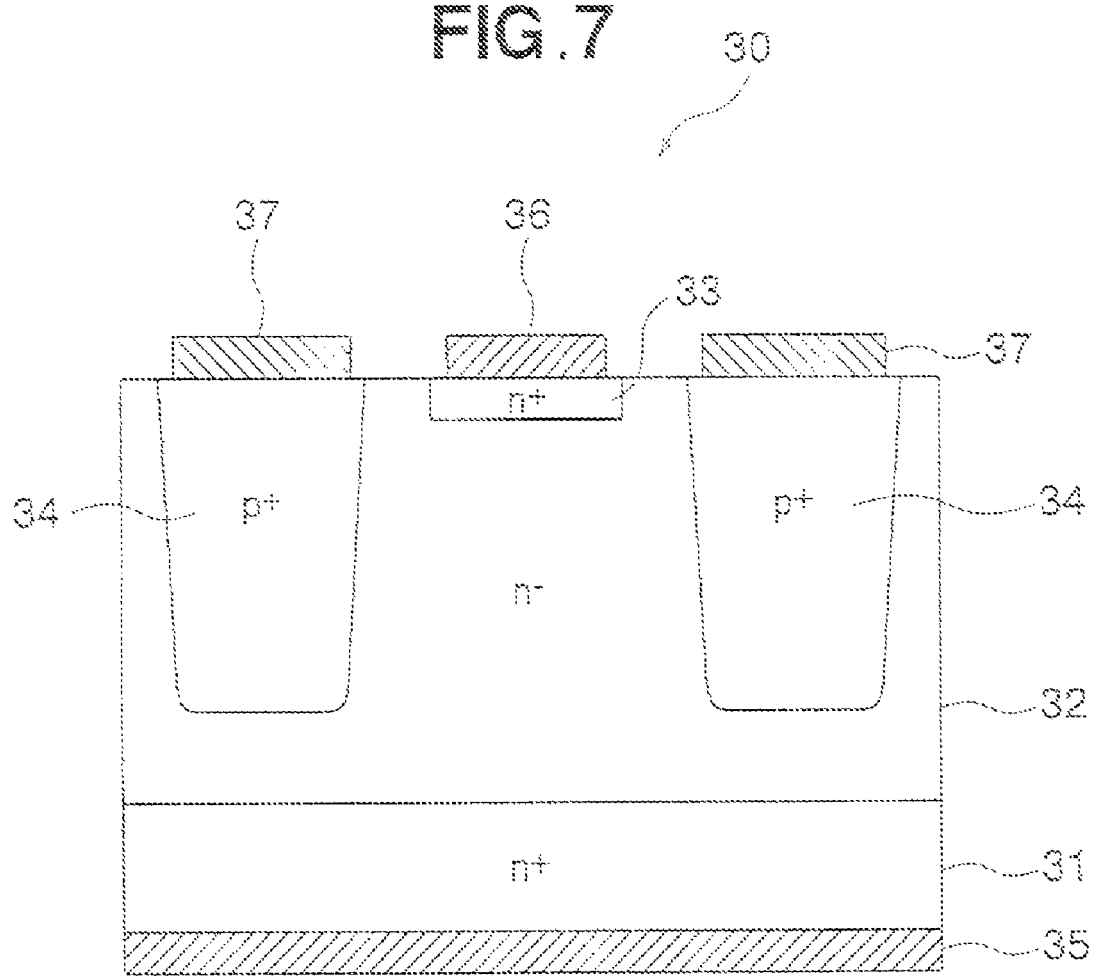

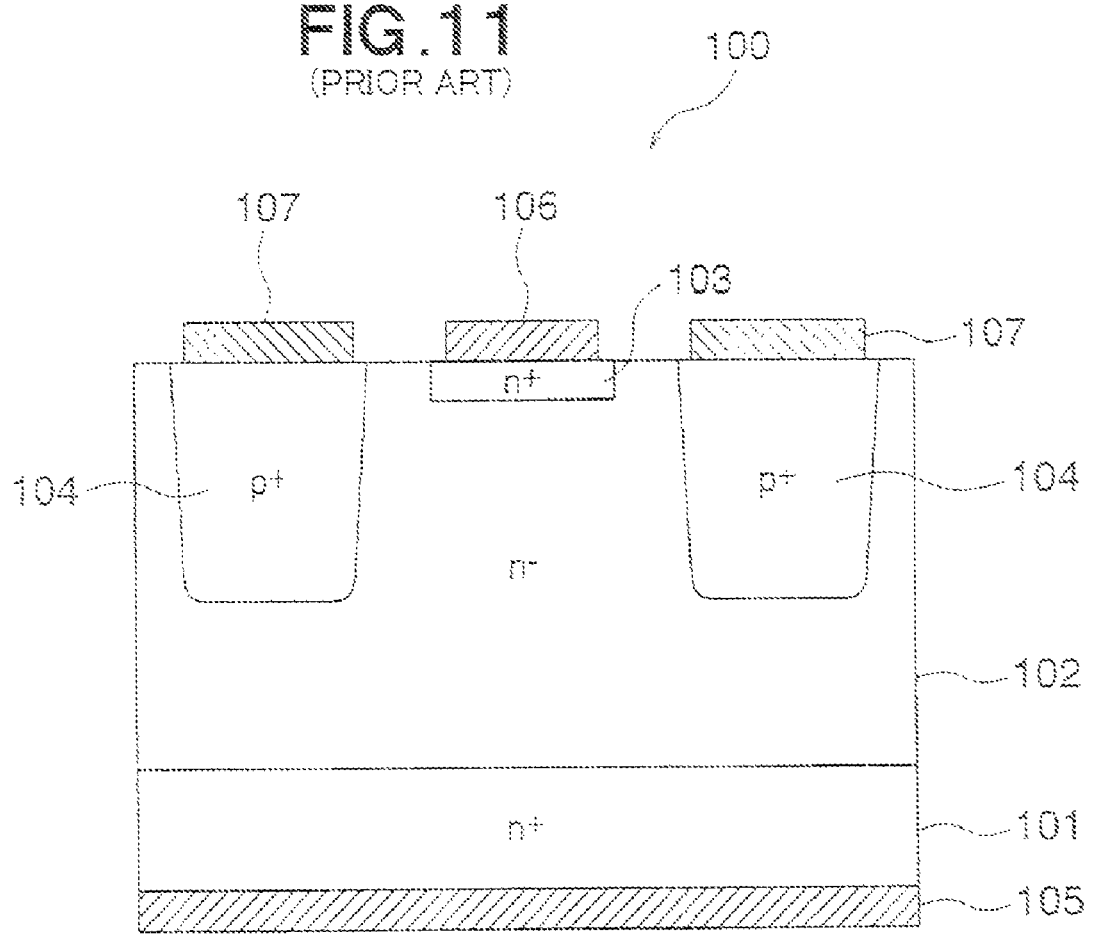

METHOD FOR MANUFACTURING ION IMPLANTATION MASK, AND METHOD FOR MANUFACTURING SILICON CARBIDE SEMICONDUCTOR DEVICE

CROSS-REFERENCE TO RELATED APPLICATION

The present application is a Divisional Application of U.S. Application No. 11,496,627 filed Aug. 1, 2006, which issued as U.S. Pat. No. 7,709,862, and claims priority under 35 U.S.C. §119 to Japanese Patent Application No. 2005-224353, filed Aug. 2, 2005, the entire contents of which are hereby incorporated by reference.

BACKGROUND OF THE INVENTION

1. Field of the Invention

The present invention relates to an ion implantation mask used in an ion implantation process for forming an electrically electroconductive area on a semiconductor substrate, to a manufacturing method thereof, to a silicon carbide semiconductor device that uses an ion implantation mask, and to a manufacturing method thereof.

2. Description of Background Art

The silicon carbide (SiC) semiconductor has a higher withstand voltage and better heat resistance than does silicon because of its larger band gaps, and is expected to have great potential when applied to power devices.

FIGS. 11 and 12 hereof respectively show in cross-section and top plan part of a junction field-effect transistor 100 as a typical example of a SiC power device. FIG. 12 illustrates an example of a junction field-effect transistor 100 having five sources. FIG. 11 illustrates on an enlarged scale the structure in cross section taken along line B-B of FIG. 12. This junction field-effect transistor 100 is composed of a drain region 101, which is an n-type low-resistance layer; a drift region 102, which is an n-type high-resistance layer; source regions 103, which are n-type low-resistance regions; gate regions 104, which are p-type low-resistance regions formed so as to enclose the source regions; and three types of electrodes, which include a drain electrode 105, source electrodes 106, and a gate electrode 107. In this structure, a high-resistance n⁻ layer 102 is formed by epitaxial growth on a low-resistance n⁺ SiC substrate (101). The substrate constitutes the drain region 101, which is one of primary electrodes. The source regions 103, which are other primary electrodes, are provided on the surface of the high-resistance n⁻ layer 102. Each of the source electrodes 106 has a long, thin shape, and multiple source electrodes 106 are in alignment separated from each other, as shown in FIG. 12. The gate electrode 107, which is a control electrode, is provided encompassing the source electrodes 106. The electric current flowing between the source electrodes 106 and the drain electrode 105 is turned on and off by a signal applied to the gate electrode 107.

The silicon process often cannot be used without modification in the production of such SiC devices because of differences in the properties of the materials used, and development of new processing techniques is a major issue. An example is a technique for forming a p⁺ gate region 104 or another selectively electroconductive region in the case shown in FIG. 11. Thermal diffusion, which is commonly used with silicon, cannot be used when a gate region 104 is formed as a selectively electroconductive region. This is because the impurities in SiC used to control the conductivity of the semiconductor have a low diffusion coefficient. In view of this, ion implantation is used exclusively with SiC to form gate regions 104 as selectively electroconductive regions.

FIG. 13 is a cross-sectional view of part of a junction field-effect transistor 100 at a manufacturing stage in which the gate region is formed by ion implantation. Elements similar to those shown in FIG. 11 are denoted by the same symbols. In ion implantation, as shown in FIG. 13, a mask 109 having openings 108 is provided in advance in order to prevent impurity ions from being implanted in the SiC in regions other than the gate region 104 to be formed, and the impurity ions are then directed onto the entire surface as shown by the arrows 110, allowing the ions to be implanted only in the required areas. High implantation energy is needed to form deep gate regions, and a special mask must be prepared when it is impossible to use the mask materials and thicknesses commonly employed with conventional silicon. Available literature (Research & Development Association for Future Electron Devices, "2002 Report on the Results Commissioned by the New Energy and Industrial Technology Development Organization, Development of Ultralow-loss Power Devices Technology, Element Processing Technology") discloses an example in which a silicon oxide film ($SiO_2$) that has a thickness of 3.2 μm and has been formed by chemical vapor deposition (CVD) is used as a mask, and aluminum ions are used to form a gate by ion implantation at a maximum energy of 1.4 MeV. A gate region with a depth of about 2 μm is thereby formed. It has also been confirmed that applying a reverse voltage to the gate electrode in a junction field-effect transistor formed in this manner causes the channels to be blocked and the transistor to be turned off. Specifically, it has been confirmed that normally-on type characteristics are exhibited so that the junction field-effect transistor is turned off when a negative voltage is applied to the gate electrode.

There is high demand for power devices that turn off when an abnormality causes a control signal to the gate to be cut off. An important condition of such power devices is that they have normally-off type characteristics. In the aforementioned publication (Research & Development Association for Future Electron Devices, "2002 Report on the Results Commissioned by the New Energy and Industrial Technology Development Organization, Development of Ultralow-loss Power Devices Technology, Element Processing Technology"), a gate depth of about 2 μm was obtained, but the junction field-effect transistor had normally-on type characteristics. In view of this, a need exists for deeper gates to be formed in order to make the transition from normally-on characteristics, in which a negative voltage is applied to the gate to turn the device off, to normally-off characteristics, in which the device can be kept off at a gate voltage of 0 V. In order to form a deeper gate region as a selectively electroconductive region, ions of higher energy must be implanted. However, in cases in which a conventional mask made of $SiO_2$ or the like is used, the implantation of high-energy ions causes problems in that the ions pass through the mask and are implanted in regions other than the openings in the mask. Another problem is that the gate region may be contaminated because the SiC is exposed through the openings in the mask, and the quality of the selectively electroconductive region may be reduced.

Therefore, a need exists for an ion implantation mask that can be used to form deeper selectively electroconductive regions and to yield higher-quality selectively electroconductive regions than in conventional practice; for a manufacturing method thereof; for a silicon carbide semiconductor device that uses this ion implantation mask; and a manufacturing method thereof.

SUMMARY OF THE INVENTION

In one aspect, the present invention provides an ion implantation mask comprising an oxide film as a protective film formed over the entire surface of a semiconductor substrate, an ion-inhibiting layer composed of an ion-inhibiting metal, and a thin metal film that is disposed between the oxide film and the ion-inhibiting layer to bond the oxide film and the ion-inhibiting layer together.

In this configuration, the ion-inhibiting layer is composed of a denser metal than a silicon oxide film used in conventional masks. Therefore, an ion implantation mask in which this ion-inhibiting layer is a component will have a higher capacity to inhibit ions than will a conventional mask. Accordingly, the ion-inhibiting layer is capable of inhibiting ions at higher energies, and a deeper selectively electroconductive region can therefore be formed in the semiconductor by implanting ions using an ion implantation mask in which this ion-inhibiting layer is a component.

It is preferable that the thin metal film used in the ion implantation mask oxidize more easily than the metal used in the ion-inhibiting layer.

In this configuration, the thin metal film constituting the ion implantation mask oxidizes more easily than the metal used in the ion-inhibiting layer. Accordingly, the interatomic bonds between the oxygen atoms of the oxide film and the metal atoms of the thin metal film are stronger than the interatomic bonds between the oxide film and the metal atoms of the ion-inhibiting layer, and the thin metal film between the ion-inhibiting layer and the oxide film therefore acts to prevent the ion-inhibiting layer from peeling away.

It is preferable that the oxide film used in the ion implantation mask be a silicon oxide film, that the thin metal film be a thin film obtained using at least one element selected from the group consisting of titanium, zirconium, vanadium, niobium, hafnium, and chromium, and that the metal used in the ion-inhibiting layer be molybdenum or tungsten.

In this configuration, the ion-inhibiting layer is composed of molybdenum or titanium, which is denser than silicon oxide films used as conventional ion implantation masks. Therefore, the ion-inhibiting layer has a higher capacity to inhibit ions than a silicon oxide film. Accordingly, this ion-inhibiting layer is capable of inhibiting ions at higher energies, and a deeper selectively electroconductive region can therefore be formed in the semiconductor by implanting ions using an ion implantation mask in which this ion-inhibiting layer is a component. Also, the thin film, which is made of titanium, zirconium, vanadium, niobium, hafnium, or chromium and which is used as the thin metal film constituting the ion implantation mask, oxidizes more easily than the molybdenum or tungsten used in the ion-inhibiting layer. Therefore, the interatomic bonds between the oxygen atoms of the oxide film and the titanium; zirconium, vanadium, niobium, hafnium, or chromium atoms of the thin metal film are stronger than the interatomic bonds between the oxide film and the molybdenum or tungsten atoms in the ion-inhibiting layer. Accordingly, the thin film made of titanium, zirconium, vanadium, niobium, hafnium, or chromium and disposed between the ion-inhibiting layer and the oxide film acts to prevent the ion-inhibiting layer from peeling away.

The present invention also provides an ion implantation mask comprising a nitride film as a protective film formed over the entire surface of a semiconductor substrate, an ion-inhibiting layer composed of an ion-inhibiting metal, and a thin metal film that is disposed between the nitride film and the ion-inhibiting layer to bond the nitride film and the ion-inhibiting layer together.

In this configuration, the ion-inhibiting layer is composed of a denser metal than silicon oxide films used as conventional masks. Therefore, an ion implantation mask in which this ion-inhibiting layer is a component will have a higher capacity to inhibit ions than will a conventional mask. Accordingly, the ion-inhibiting layer is capable of inhibiting ions at higher energies, and a deeper selectively electroconductive region can therefore be formed in the semiconductor by implanting ions using an ion implantation mask in which this ion-inhibiting layer is a component.

It is preferable that the thin metal film used in the ion implantation mask nitride more easily than the metal used in the ion-inhibiting layer.

In this configuration, the thin metal film that constitutes the ion implantation mask forms a nitride more easily than the metal used in the ion-inhibiting layer. Accordingly, the interatomic bonds between the nitrogen atoms of the nitride film and the metal atoms of the thin metal film are stronger than the interatomic bonds between the nitride film and the metal atoms of the ion-inhibiting layer, and the thin metal film between the ion-inhibiting layer and the nitride film therefore acts to prevent the ion-inhibiting layer from peeling away.

It is preferable that the nitride film used in the ion implantation mask be a silicon oxide film, that the thin metal film be a thin film obtained using at least one element selected from the group consisting of titanium, zirconium, vanadium, niobium, hafnium, and chromium, and that the metal used in the ion-inhibiting layer be molybdenum or tungsten.

In this configuration, the ion-inhibiting layer is composed of molybdenum or titanium, which is denser than silicon oxide films used as conventional ion implantation masks, and the ion-inhibiting layer therefore has a higher capacity to inhibit ions than does a silicon oxide film. Accordingly, this ion-inhibiting layer is capable of inhibiting ions at higher energies, and a deeper selectively electroconductive region can therefore be formed in the semiconductor by implanting ions using an ion implantation mask in which this ion-inhibiting layer is a component. Also, the thin film that is made of titanium, zirconium, vanadium, niobium, hafnium, or chromium and that is used as the thin metal film that constitutes the ion implantation mask forms a nitride more easily than the molybdenum or tungsten used in the ion-inhibiting layer. Therefore, the interatomic bonds between the nitrogen atoms of the nitride film and the titanium, zirconium, vanadium, niobium, hafnium, or chromium atoms of the thin metal film are stronger than the interatomic bonds between the nitride film and the molybdenum atoms or tungsten atoms in the ion-inhibiting layer. Accordingly, the thin film made of titanium, zirconium, vanadium, niobium, hafnium, or chromium and disposed between the ion-inhibiting layer and the nitride film acts to prevent the ion-inhibiting layer from peeling away.

Furthermore, the present invention provides a method for manufacturing an ion implantation mask comprising an oxide film formation step for forming an oxide film as a protective film over the entire surface of a semiconductor substrate, a thin metal film formation step for forming a thin metal film over the oxide film, and an ion-inhibiting layer formation step for forming an ion-inhibiting layer composed of an ion-inhibiting metal over the thin metal film.

It is preferable that the thin metal film used in the method for manufacturing an ion implantation mask oxidize more easily than the metal used in the ion-inhibiting layer.

It is preferable that the oxide film used in the method for manufacturing an ion implantation mask be a silicon oxide film, that the thin metal film be a thin film obtained using at least one element selected from the group consisting of titanium, zirconium, vanadium, niobium, hafnium, and chromium, and that the metal used in the ion-inhibiting layer be molybdenum or tungsten.

The present invention also provides a method for manufacturing an ion implantation mask comprising a nitride film formation step for forming a nitride film as a protective film over the entire surface of a semiconductor substrate, a thin metal film formation step for forming a thin metal film over the nitride film, and an ion-inhibiting layer formation step for forming an ion-inhibiting layer composed of an ion-inhibiting metal over the thin metal film.

It is preferable that the thin metal film used in the method for manufacturing an ion implantation mask nitride more easily than the metal used in the ion-inhibiting layer.

It is preferable that the nitride film used in the method for manufacturing an ion implantation mask be a silicon nitride film, that the thin metal film be a thin film obtained using at least one element selected from the group consisting of titanium, zirconium, vanadium, niobium, hafnium, and chromium, and that the metal used in the ion-inhibiting layer be molybdenum or tungsten.

Furthermore, the present invention provides a silicon carbide semiconductor device comprising a first electroconductive high-resistance layer formed on a silicon carbide semiconductor substrate, which is a first electroconductive low-resistance layer; source regions composed of the first electroconductive low-resistance layer; a gate region, which is a second electroconductive low-resistance layer formed by ion implantation using the ion implantation mask configured as described above; and source electrodes, a gate electrode, and a drain electrode.

The present invention also provides a method for manufacturing a silicon carbide semiconductor device, comprising a high-resistance layer formation step for forming a first electroconductive high-resistance layer on a silicon carbide semiconductor substrate, which is a first electroconductive low-resistance layer; a low-resistance layer formation step for forming a first electroconductive low-resistance layer that will constitute source regions; a gate region formation step for forming a gate region, which is a second electroconductive low-resistance layer formed by ion implantation using the ion implantation mask having the configuration described above; and an electrode formation step for forming source electrodes, a gate electrode, and a drain electrode.

According to the present invention, the ion-inhibiting layer is composed of a denser metal than a silicon oxide film used in conventional masks, and an ion implantation mask in which this ion-inhibiting layer is a component will therefore have a higher capacity to inhibit ions than will a conventional mask. Accordingly, the ion-inhibiting layer is capable of inhibiting ions at higher energies, and a deeper selectively electroconductive region can therefore be formed in the semiconductor by implanting ions using an ion implantation mask in which this ion-inhibiting layer is a component. Also, the thin metal film constituting this ion implantation mask oxidizes more easily than the metal used in the ion-inhibiting layer, and the interatomic bonds between the oxygen atoms of the oxide film and the metal atoms of the thin metal film are therefore stronger than the interatomic bonds between the oxide film and the metal atoms of the ion-inhibiting layer. Accordingly, the thin metal film disposed between the ion-inhibiting layer and the oxide film acts to prevent the ion-inhibiting layer from peeling away.

According to the present invention, the ion implantation mask is a multilayer film composed of several types of materials, and it is therefore possible to easily retain only the oxide film or the nitride film by controlling the etching conditions so that the etch rate differs depending on the type of material. The semiconductor substrate can be protected by the remaining unetched oxide film or nitride film from being contaminated. Therefore, the process is stable and is of high quality.

According to the present invention, a deeper selectively electroconductive region can be formed in the semiconductor as described above, and the process is stable and of high quality. Therefore, a high-quality silicon carbide semiconductor device can be manufactured.

BRIEF DESCRIPTION OF THE DRAWINGS

Certain preferred embodiments of the present invention will be described in detail below, by way of example only, with reference to the accompanying drawings, in which

FIG. 6 is a graph of the results of measuring the aluminum concentration on the semiconductor surface when aluminum ions have been implanted into a specimen obtained by forming a molybdenum film on a semiconductor substrate;

FIG. 7 is a cross-sectional view of part of a silicon carbide semiconductor device in an embodiment of the present invention;

FIG. 11 is a cross-sectional view of part of a conventional junction field-effect transistor;

DETAILED DESCRIPTION OF THE PREFERRED EMBODIMENTS

Figure 1:
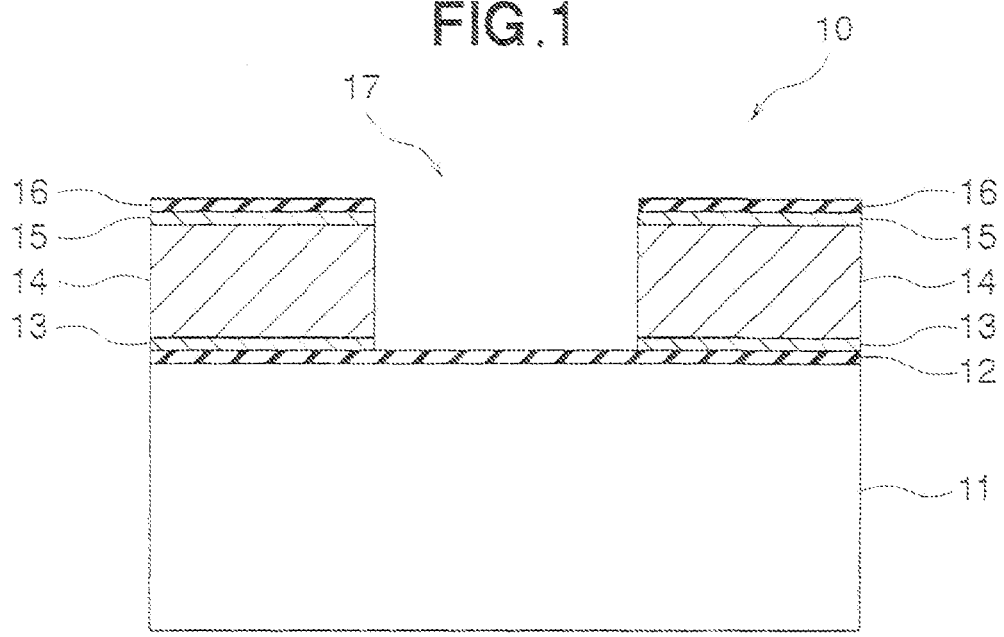
FIG. 1 is a longitudinal cross-sectional view showing the basic structure of an ion implantation mask according to an embodiment of the present invention.
Figure 2:
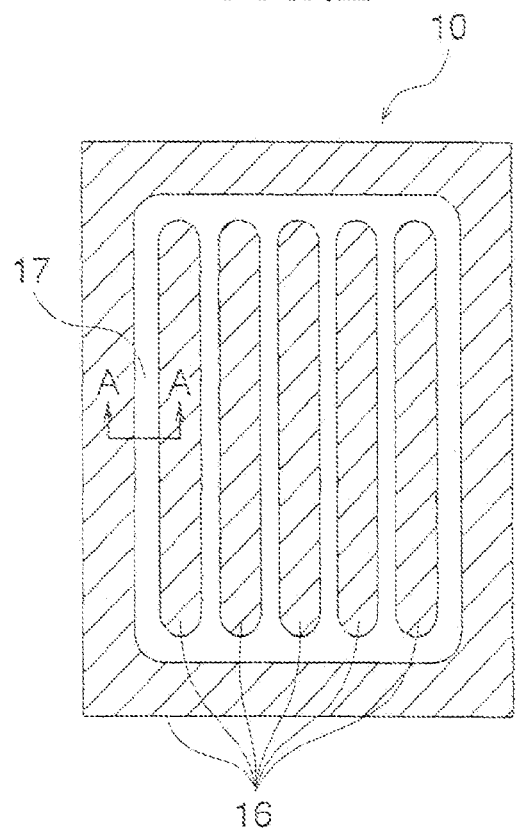
FIG. 2 is a plan view showing the basic structure of an ion implantation mask according to an embodiment of the present invention.

Reference is made initially to FIGS. 1 and 2, showing, respectively in longitudinal cross-section and top plan, the basic structure of an ion implantation mask 10 of the present invention. This ion implantation mask 10 can be used, for example, in an ion implantation process when a SiC power device is manufactured. In view of this, a mask for manufacturing the gate region of a SiC junction field-effect transistor is described as an example. FIG. 2 shows part of the ion implantation mask 10 as seen from the top of a substrate 11 in a manufacturing process in which an opening 17 is provided in order to form a gate region, which is a selectively electroconductive region disposed on the periphery of five source regions. FIG. 1 shows an enlarged view of the cross sectional structure along line A-A in FIG. 2. Structures are formed on the SiC substrate 11 by forming a drain region, source regions, and other regions whose formation precedes the formation of the gate region, but these structures are omitted because the present embodiment is only intended to describe the structure of the ion implantation mask.

The ion implantation mask 10 comprises a first oxide film 12 composed of a silicon oxide film ($SiO_2$) and formed over the entire surface of the SiC substrate 11, a first thin metal film 13 composed of titanium (Ti) and formed on the first oxide film 12, an ion-inhibiting layer 14 composed of molybdenum (Mo) and formed on the first thin metal film 13, a second thin metal film 15 composed of titanium and formed on the ion-inhibiting layer 14, and a second oxide film 16 composed of a silicon oxide film ($SiO_2$) and formed on the second thin metal film 15. An opening 17 is created, leaving only the first oxide film 12 remaining in order to implant ions to form a gate region.

The ion-inhibiting layer 14 is composed of a metal that is denser than a silicon oxide film used in a conventional mask. An ion implantation mask 10 that has this ion-inhibiting layer 14 as a component will therefore have a greater capacity to inhibit ions than will a conventional mask. Therefore, the ion-inhibiting layer 14 is capable of inhibiting ions of greater energy, and an ion implantation mask 10 having this ion-inhibiting layer 14 as a component can be used to implant ions of greater energy, whereby a deeper selectively electroconductive region (gate region) is formed in the semiconductor while ions are adequately inhibited by the mask portion.

The metal molybdenum that is used in the ion-inhibiting layer 14 can be easily formed by a sputtering device or a vapor deposition device, or etching can also be readily performed. Specifically, a conventional semiconductor processing apparatus can be used without modification to perform the processing in which molybdenum is used. Furthermore, there is only a small difference in the coefficient of thermal expansion between molybdenum and the SiC substrate 11. Therefore, the thermal stress that acts on the ion-inhibiting layer 14 is low when an ion-inhibiting layer 14 composed of molybdenum is formed at a high temperature and the substrate is then returned to room temperature. Accordingly, cracks do not easily form in the ion-inhibiting layer 14, and a high-quality ion-inhibiting layer 14 can be formed. Therefore, ion implantation can be more satisfactorily reduced by the ion-inhibiting layer 14.

The titanium thin film used in the first thin metal film 13 and the second thin metal film 15 constituting the ion implantation mask 10 is more easily oxidized than molybdenum, which is the metal used in the ion-inhibiting layer 14. Specifically, the interatomic bonds between the oxygen atoms in the oxide films 12, 16 and the titanium atoms of the thin metal films 13, 15 are stronger than the interatomic bonds between the oxide films 12, 16 and the molybdenum bonds of the ion-inhibiting layer 14. Therefore, the thin metal films 13, 15 composed of titanium thin films between the ion-inhibiting layer 14 and the oxide films 12, 16 act as adhesive layers that prevent the ion-inhibiting layer 14 from peeling off.

The reasons that titanium oxidize more easily than molybdenum will now be described. The standard free energy change (or the standard enthalpy change of formation obtained by adding the enthalpy change to the standard free energy change) of oxidation reactions is used as a measure of how easily oxidation occurs at the operating temperature of the ion implantation mask 10. It is believed that oxidation occurs more easily with greater negative absolute values of standard free energy change in oxidation reactions. Table 1 shows the standard enthalpy change of formation $\Delta H°$ per mole of the metal for oxidation reactions of various metals.

TABLE 1

| Metal | $\Delta H°$ (kJ/mol) |
|---|---|
| Ti | −916.3 |
| Zr | −1094.5 |
| Hf | −1120.9 |
| V | −736.8 |
| Nb | −800.0 |
| Cr | −581.2 |
| W | −569.9 |
| Mo | −543.5 |

As shown in Table 1, the standard enthalpy change of formation in an oxidation reaction that involves molybdenum is −543.5 (kJ/mol), and the standard enthalpy change of formation in an oxidation reaction that involves titanium is −916.3 (kJ/mol). Consequently, titanium has a greater negative absolute value of standard enthalpy of formation in an oxidation reaction than does molybdenum. Therefore, it is fair to say that titanium oxidizes more easily than molybdenum, because the negative absolute value of standard free energy obtained by subtracting the entropy change in an oxidation reaction from these values is also greater for titanium than for molybdenum.

Titanium can also be formed into a film more easily by a commonly used sputtering device or vapor deposition device, and is more easily subjected to etching. Therefore, titanium is suitable as the metal used in the first thin metal film and the second thin metal film. A material other than titanium may also be used as the thin metal films 13, 15 as long as this material can be employed in commonly used semiconductor processes, oxidizes easily, and can function sufficiently as an adhesive layer. Other possible examples besides titanium include zirconium, vanadium, niobium, hafnium, and chromium.

The second oxide film 16 is formed to function as a mask during the etching of molybdenum that forms the ion-inhibiting layer 14. If a photoresist can be formed directly on the molybdenum layer, then the second thin metal film 15 and the second oxide film 16 are not necessary. However, a photoresist cannot be formed directly on molybdenum in the reaction system of a processing device in which molybdenum is etched using reactive ion etching (RIE) in a conventional $CF_4/O_2$ gas mixture, and the second oxide film 16 is therefore provided in such a system.

The ion implantation mask 10 shown in FIG. 1 is used as a mask structure that performs the functions of an inhibiting layer for aluminum ion implantation at 3 MeV or more. Molybdenum, which is primarily used as the ion-inhibiting layer 14 for inhibiting high-energy ions, is a material that can be formed into a film having a thickness of several micrometers by a semiconductor processing device, has a high capacity to inhibit ions, lends itself very easily to semiconductor processing, and has a coefficient of thermal expansion near that of the semiconductor material.

In addition to molybdenum, tungsten is another example of a material can be used for the ion-inhibiting layer 14 because tungsten also has the properties described above. As shown in Table 1 in FIG. 3, the standard enthalpy change of formation in an oxidation reaction involving tungsten is −569.9 (kJ/mol), which is a lower negative absolute value than the standard enthalpy change of formation of −916.3 (kJ/mol) in an oxidation reaction involving titanium. Tungsten is as difficult to oxidize as molybdenum. Therefore, an ion-inhibiting layer 14 in which tungsten is used can be made more difficult to peel away from the first oxide film 12 by using a titanium thin film as the first thin metal film 13. Furthermore, the difference in the coefficient of thermal expansion between tungsten and SiC is small. Therefore, when an ion-inhibiting layer 14 composed of tungsten is formed at high temperatures and then returned to room temperature, cracks are not likely to form in the ion-inhibiting layer 14 because only minimal thermal stress develops in the ion-inhibiting layer 14. Accordingly, using tungsten allows a high-quality ion-inhibiting layer 14 to be formed, and an ion implantation mask that satisfactorily inhibits ion implantation can be formed.

Figure 3:
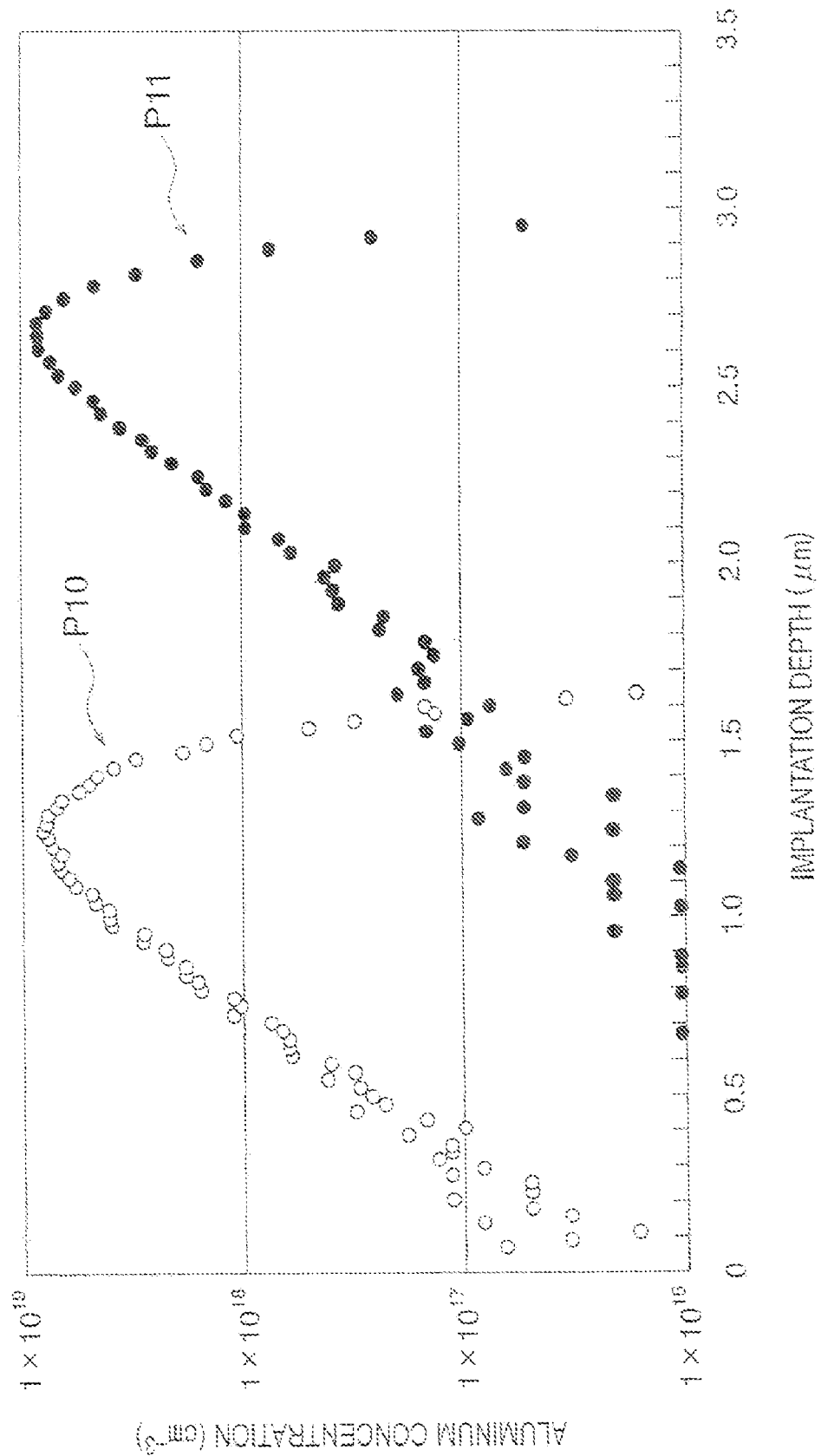
FIG. 3 is a graph depicting the results of simulating the distribution of aluminum in silicon oxide and molybdenum when aluminum ions are implanted with energies of 3 MeV.

FIG. 3 shows the results of a simulation conducted to confirm the high capacity of the molybdenum to inhibit ions. FIG. 3 shows the results of simulating the distribution of aluminum in silicon oxide and molybdenum when aluminum is implanted at 3 MeV. The horizontal axis indicates the depth of implantation, and the vertical axis indicates aluminum concentration. The white circle plot P10 indicates the aluminum concentration at various implantation depths when aluminum ions are implanted in molybdenum. The black circle plot P11 indicates aluminum concentration at various implantation depths when aluminum ions are implanted in silicon oxide. The thickness at which the concentration of aluminum decreases three orders of magnitude from the peak concentration of about $1 \times 10^{19}$ cm$^{-3}$ to $1 \times 10^{16}$ cm$^{-3}$ is about 3 µm with the silicon oxide and about 1.7 µm with molybdenum. Thus, when molybdenum is used for the inhibition layer, the mask thickness can be expected to be reduced by about one half.

During ion implantation, it is preferable that the semiconductor surface not be exposed and be covered by a thin silicon oxide film or the like in order to prevent contamination. Therefore, in the present invention, the semiconductor surface is covered by a first oxide film 12 composed of a silicon oxide film, as shown in FIG. 1.

As described above, the ion implantation mask 10 is capable of inhibiting aluminum ions at high energies of 3 MeV or greater. Also, since there is a small difference between the coefficient of thermal expansion of the SiC substrate 11 and the coefficient of thermal expansion of the tungsten or molybdenum used in the ion-inhibiting layer 14, a small amount of thermal stress acts on the ion-inhibiting layer 14 when the temperature is returned to room temperature from the high temperature used during the formation of the ion-inhibiting layer 14. It is therefore possible to form a high-quality ion implantation mask 10. Furthermore, the ion-inhibiting layer 14 can be prevented from peeling away because a first thin metal film 13 composed of titanium, which oxidizes more easily than molybdenum or tungsten, is disposed between the first oxide film 12 and the ion-inhibiting layer 14.

Reactive ion etching (RIE) or another semiconductor process can be used to process molybdenum under conditions of etching selectivity with regard to silicon oxide. When molybdenum or tungsten is etched using the topmost second oxide film 16 as a mask, the molybdenum or tungsten can be etched at a high speed by using conditions that allow for a high etch rate ratio of the first oxide film 12 and molybdenum or tungsten. After the etching of the titanium and either the molybdenum or the tungsten is complete, the etching rate decreases when the first oxide film 12 on the SiC is exposed, and it is therefore easy to stop the etching at this point. It is thus easy to complete the etching process with only minimal etching of the first oxide film 12, which protects the SiC surface from being contaminated. Furthermore, the etching process can be controlled with greater precision by incorporating a method that uses optical interference to detect when the etching has ended.

Figure 4:
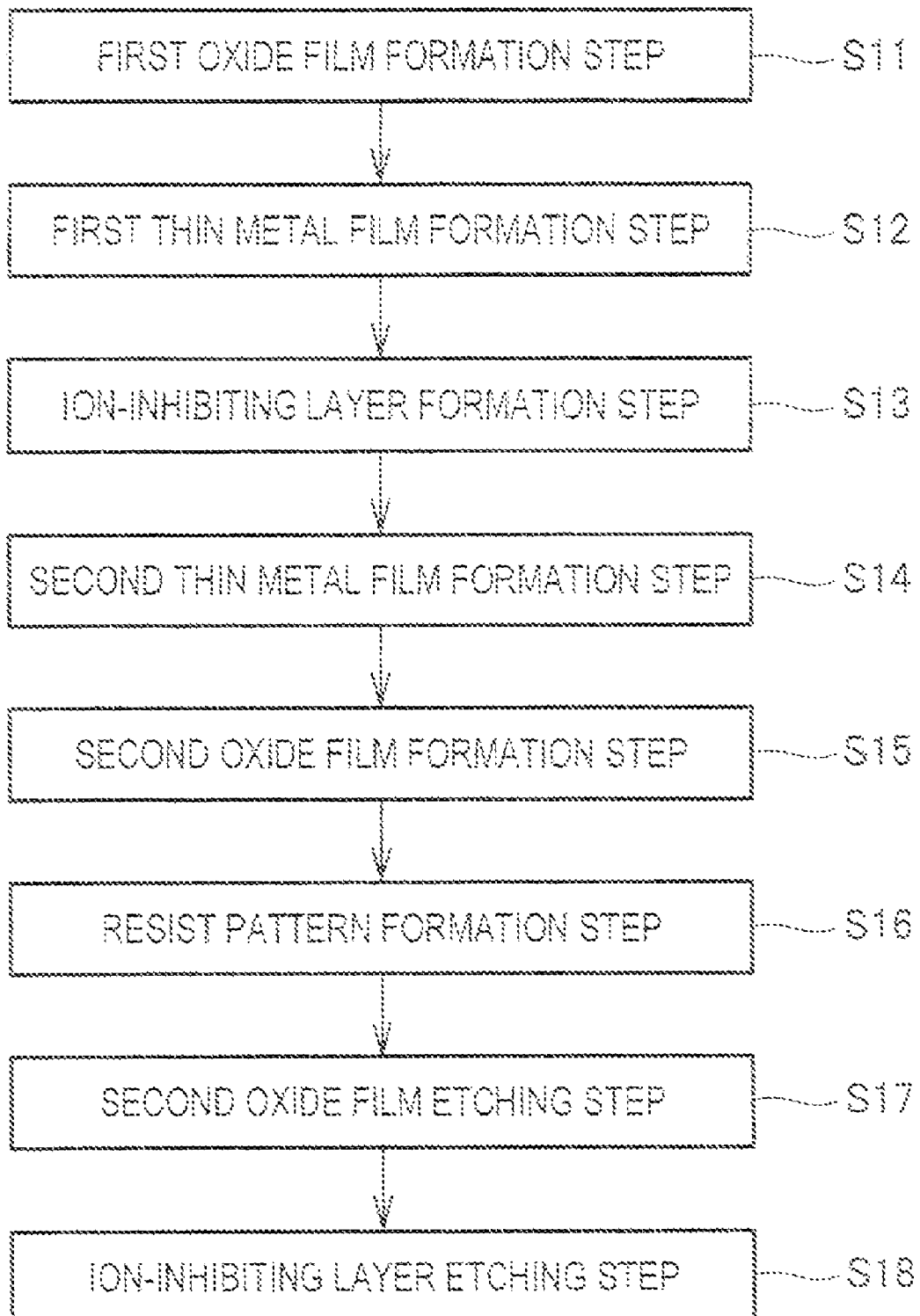
FIG. 4 is a flowchart depicting the steps of manufacturing an ion implantation mask according to the method for manufacturing an ion implantation mask in an embodiment of the present invention.

FIG. 4 is a flowchart depicting the method for manufacturing the ion implantation mask 10 according to the present invention. The method for manufacturing the ion implantation mask 10 comprises a first oxide film formation step (step S11) for forming a first oxide film 12 composed of a silicon oxide film over the entire surface of the semiconductor substrate, a first thin metal film formation step (step S12) for forming a first thin metal film 13 composed of titanium over the first oxide film 12, an ion-inhibiting layer formation step (step S13) for forming an ion-inhibiting layer 14 composed of molybdenum over the first thin metal film 13, a second thin metal film formation step (step S14) for forming a second thin metal film 15 composed of titanium over the ion-inhibiting layer 14, and a second oxide film formation step (step S15) for forming a second oxide film 16 composed of a silicon oxide film over the second thin metal film 15. As described above, step S14, step S15, and step S17 may be omitted for some processing devices. The titanium used in the first thin metal film 13 and the second thin metal film 15 in this manufacturing method oxidizes more easily than the molybdenum used in the ion-inhibiting layer 14. The method for manufacturing the ion implantation mask 10 also has a resist pattern formation step (step S16), a second oxide film etching step (step S17), and an ion-inhibiting layer etching step (step S18).

Figure 5A:
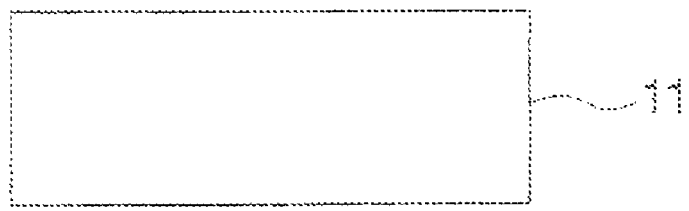
FIGS. 5A through 5F are cross-sectional views of a semiconductor substrate in the various steps of manufacturing an ion implantation mask according to the method for manufacturing an ion implantation mask in an embodiment of the present invention.
Figure 5B:
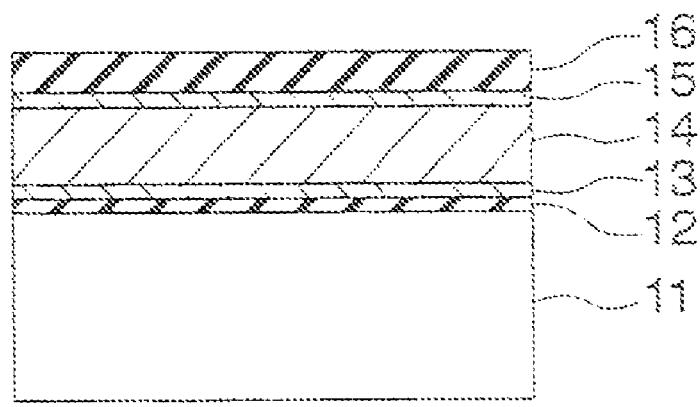

Next, FIGS. 5A through 5F are diagrams describing the process of forming the ion implantation mask 10 of the present invention. A substrate that is offset from the 4H—SiC (0001) surface by 8° is used for the substrate 11 (FIG. 5A). In the first oxide film formation step (step S11), the substrate 11 is washed and is then heat-oxidized to form a silicon oxide film on the SiC surface. This layer constitutes the first oxide film 12. In this example, an oxide film of about 50 nm can be formed by oxidation for 20 hours at a temperature of 1100° C. in a dry oxygen atmosphere. The oxide film 12 can also be formed by chemical vapor deposition (CVD).

Next, in the first thin metal film formation step (step S12), titanium having a thickness of 50 nm is deposited by sputtering to form the first thin metal film 13. In the ion-inhibiting layer formation step (step S13), molybdenum having a thickness of 2.3 µm is deposited by sputtering to form the ion-inhibiting layer 14.

The thickness 2.3 µm of the molybdenum used in the ion-inhibiting layer 14 is determined from the test results shown in FIG. 6. FIG. 6 shows the results of subjecting a specimen obtained by forming an Mo film on an Si semiconductor surface to ion implantation in 11 steps at a maximum implantation energy of 3 MeV and an Al concentration of $5 \times 10^{19}$ cm$^{-3}$, and then measuring the Al concentration on the Si semiconductor surface. The horizontal axis indicates the thickness of the molybdenum, and the vertical axis indicates the aluminum concentration on the semiconductor surface. The actual ion implantation requires a thicker Mo layer than calculated because of a gently sloping distribution of implanted ions unanticipated in the simulation results shown in FIG. 3, but it is clear that the Al ions can be sufficiently inhibited by molybdenum having a thickness of 2.3 µm. Consequently, in the present embodiment, a thickness of 2.3 µm was used for the ion-inhibiting layer 14. The Al concentration does not change at a thickness of 2.3 μm or greater, and this is believed to be because of the limitations of the measuring device that is used.

In the second thin metal film formation step (step S14), titanium having a thickness of 50 nm is then deposited by sputtering to form the second thin metal film 15.

In the second oxide film formation step (step S15), a 1.2 μm silicon oxide film is subsequently formed by CVD or another method. This layer constitutes the second oxide film 16. The ion implantation multilayer film shown in FIG. 5B can be formed through the steps described above. The thicknesses of the layers used herein are merely an example and can be appropriately varied according to the depth of the ion implantation layer to be formed.

Figure 5C:
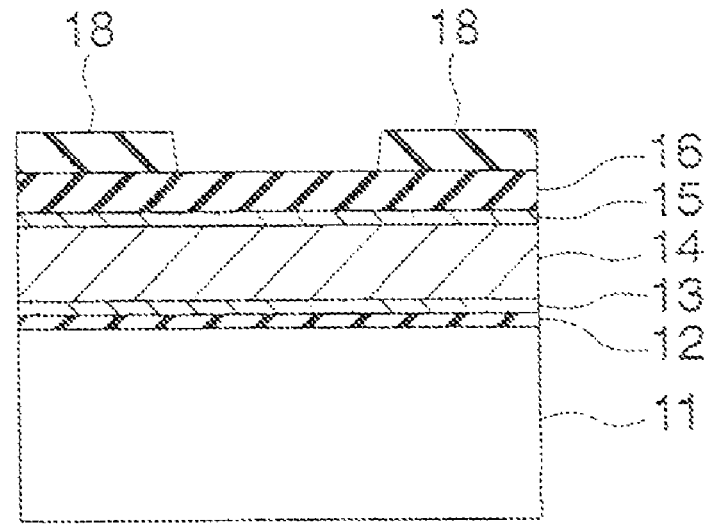

After the multilayer film is formed, the following process is conducted. In the resist pattern formation step (step S16), a photoresist pattern is first formed by a photoresist 18 on the multilayer film in a commonly used photolithography step (FIG. 5C).

Figure 5D:
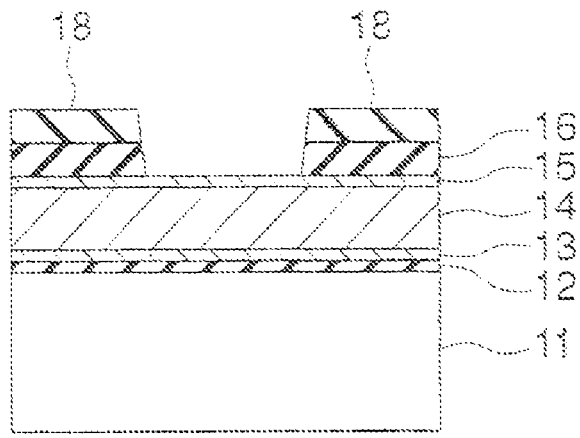

In the second oxide film formation step (step S17), a second oxide film 16 composed of a silicon oxide film is subsequently processed using the photoresist 18 as a mask (FIG. 5D). For example, the silicon oxide film can be etched by reactive ion etching (RIE) in a gas mixture of $CHF_3$, argon, oxygen, and the like.

After the silicon oxide film is etched, the photoresist 18 is removed with oxygen plasma.

Figure 5E:
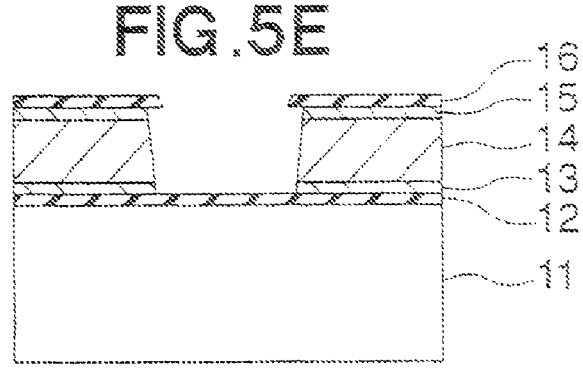

Then, in the ion-inhibiting layer etching step (step S18), the second thin metal film 15, the ion-inhibiting layer 14, and the first thin metal film 13 (Ti/Mo/Ti layer) are etched by RIE or the like in a gas mixture of $CF_4$ and oxygen using a silicon oxide film as a mask (FIG. 5E). The etch rate ratio of the Mo/silicon oxide film can be increased to 3 or greater by adjusting the etching conditions. Etching is stopped when etching of the bottommost titanium layer (first thin metal film 13) is complete.

The process is easily completed with the bottommost first oxide film 12 remaining, because the first oxide film 12 is etched under conditions with a low etching rate. More-precise control can also be achieved by conducting while the etching state is monitored based on optical interference by using an observation region on the substrate.

Figure 5F:
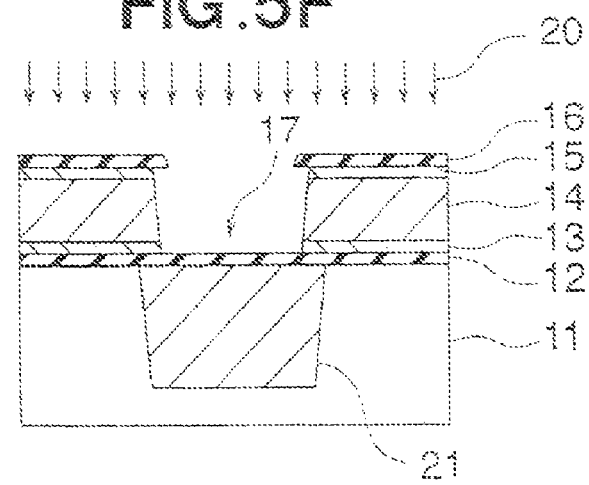

Aluminum ions are implanted at high energies (for example, 3 MeV) as shown by the arrows 20 from the top of the ion implantation mask formed as described above, whereby the aluminum ions are implanted in the substrate 11 through the opening 17, and a selectively electroconductive region 21 (gate region) is formed (FIG. 5F).

Aluminum ions were implanted at a maximum energy of 3 MeV and a concentration of $1 \times 10^{19}$ $cm^{-3}$ by using the ion implantation mask 10 manufactured as described above, and it was found that the implantation depth, defined as the point at which the aluminum concentration decreases to $1 \times 10^{16}$ $cm^{-3}$, was about 2.5 μm. Also, in cases in which implantation was conducted at a temperature of 800° C., no problems whatsoever occurred with pattern collapse or the like. These techniques were used to create a junction field-effect transistor, and satisfactory characteristics were obtained.

FIG. 7 shows a cross-sectional structure of part of a silicon carbide semiconductor device 30 (example of a junction field-effect transistor) according to an embodiment of the present invention. The device which was formed using the ion implantation mask 10 described above. The junction field-effect transistor 30 has a drain region 31, which is an n-type low-resistance layer; a drift region 32, which is an n-type high-resistance layer; source regions 33, which are n-type low-resistance regions; a gate region 34, which is a p-type low-resistance region formed to enclose the source regions 33; and a drain electrode 35, source electrodes 36, and a gate electrode 37. In this structure, a high-resistance n⁻ layer (32) is formed by epitaxial growth on a low-resistance n⁺ SiC substrate. The substrate constitutes the drain region 31, which is one of primary electrodes. The source regions 33, which constitute other primary electrodes, are provided on the surface of the high-resistance n⁻ layer (32). Each of the source regions 33 and source electrodes 36 has a long, thin shape, and multiple source electrodes 36 are in alignment separated from each other, similar to the conventional junction field-effect transistor 100 shown in FIG. 14. The gate electrode 37, which is a control electrode, is provided encompassing the source electrodes 36. The electric current flowing between the source electrodes 36 and the drain electrode 35 is turned on and off by a signal applied to the gate electrode 37. When the gate region 34 is produced in this junction field-effect transistor 30, the ion implantation mask 10 is used to implant aluminum ions at high energies, whereby a gate region 34 is formed deeper than the gate region 104 of the conventional junction field-effect transistor 100 shown in FIG. 11.

Figure 8A:
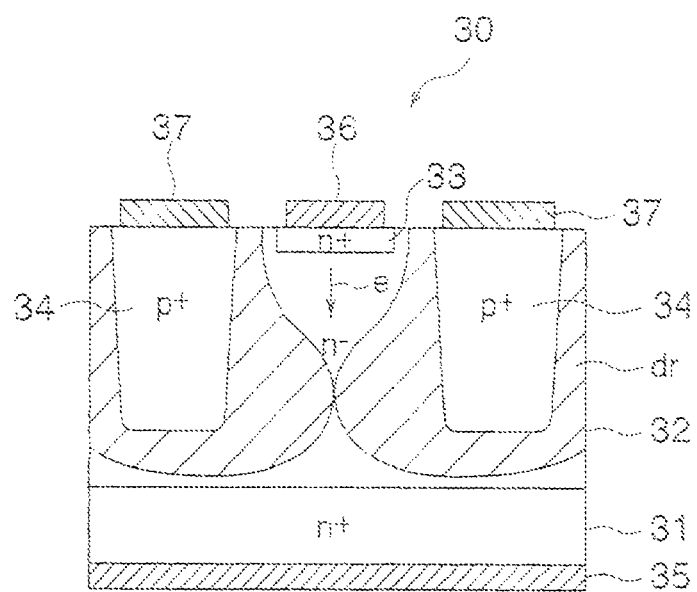
FIGS. 8A through 8C are diagrams describing the operation of a junction field-effect transistor in an embodiment of the present invention.
Figure 8B:
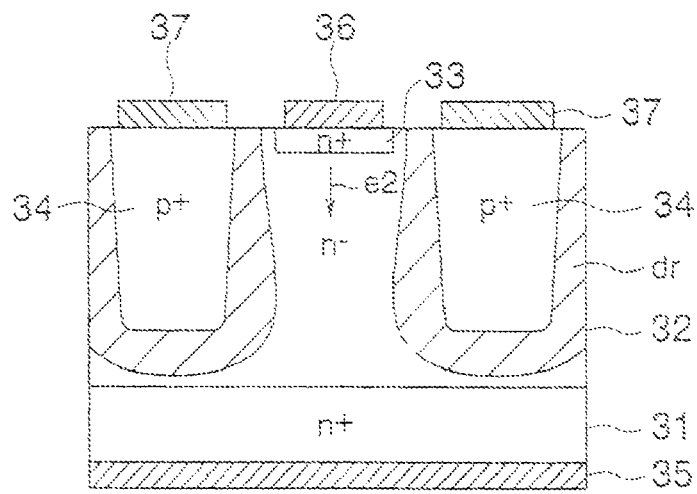
Figure 8C:
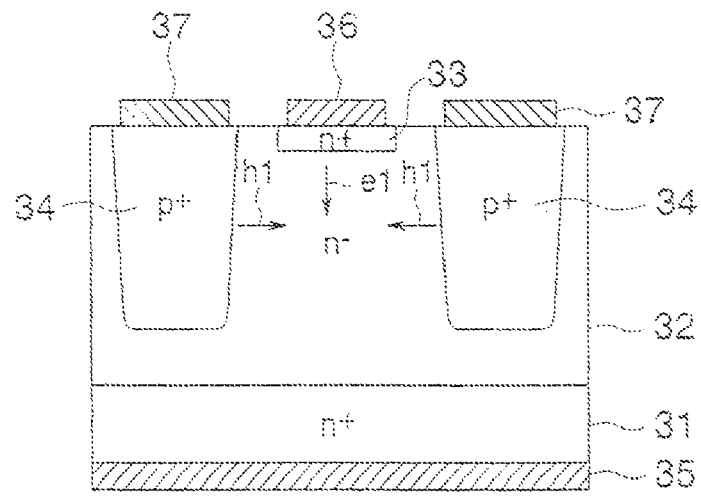

FIGS. 8A through 8C are diagrams describing the operation of the junction field-effect transistor 30 according to the present embodiment. FIG. 8A shows a state in which a drain voltage VD is applied between the source electrodes 36 and the drain electrode 35, and in which a voltage equal to or less than the pinch-off voltage is applied to the gate electrode 37 in the junction field-effect transistor 30. At this time, the depletion region dr expands within the drift region of the gate region 34, and electrons (arrow e) from the source regions 33 are blocked by the depletion layer dr and do not pass through the drift region. As shown in FIG. 8B, when a voltage equal to or greater than the pinch-off voltage is applied to the gate electrode 37, the depletion layer grows smaller, electrons (arrow e2) pass between the source electrodes 36 and the drain electrode 35, and an electric current flows through. Also, when voltage is further applied to the gate electrode 37 as shown in FIG. 8C, holes (arrows h1) are injected in the drift region 32 from the gate region 34. Electrons (arrow e1) are thereby injected from the source regions 33, and the conductivity of the high-resistance layer 32 is changed so that the charge neutrality condition is satisfied. The conductivity of the high-resistance layer 32 is thereby changed and the on-resistance decreases.

The junction field-effect transistor 100 produced by the conventional manufacturing method shown in FIG. 11 does not have a deep gate region 104, and therefore has normally-on characteristics with a pinch-off voltage of zero volts or less. However, the junction field-effect transistor 30 of the present invention has a deep gate region 34, and therefore has normally-off characteristics with a pinch-off voltage of zero volts or greater.

Consequently, the junction field-effect transistor 30 according to the present invention has the characteristic of being turned off when an abnormality occurs to block the control signal to the gate.

Next, the method for manufacturing the silicon carbide semiconductor device according to an embodiment of the present invention will be described.

Figure 9:
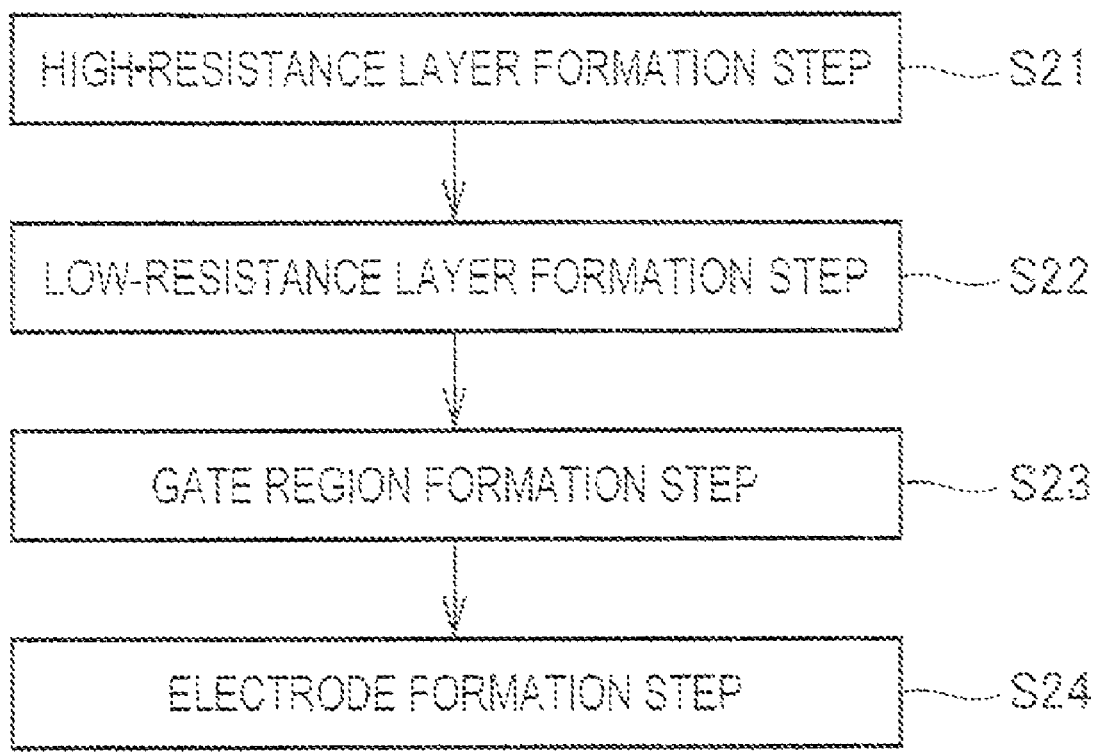
FIG. 9 is a flowchart showing the steps of manufacturing a junction field-effect transistor according to the method for manufacturing a silicon carbide semiconductor device in an embodiment of the present invention.

FIG. 9 is a flowchart showing the steps of manufacturing a junction field-effect transistor by means of the method for manufacturing the silicon carbide semiconductor device according to an embodiment of the present invention. FIGS. 10A through 10F are cross-sectional structural views of each of these steps. The method for manufacturing the silicon carbide semiconductor device has a high-resistance layer formation step (step S21) for forming an n⁻ type high-resistance layer 32 on a first electro-conductive (n⁺ type) silicon carbide semiconductor substrate 31, a low-resistance layer formation step (step S22) for forming a first electroconductive (n⁺ type) low-resistance layer 33 that will constitute the source regions, a gate region formation step (step S23) implanting ions by using the ion implantation mask 10 to form a second electro-conductive (p⁺ type) gate region 34, and an electrode formation step (step S24) for forming the source electrodes 36, the gate electrode 37, and the drain electrode 35.

Figure 10A:
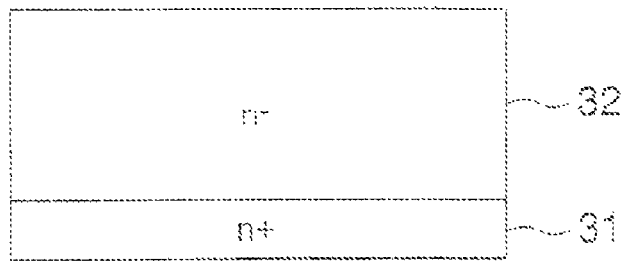
FIGS. 10A through 10F are cross-sectional views of a semiconductor substrate in the various steps of manufacturing a junction field-effect transistor according to the method for manufacturing a silicon carbide semiconductor device in an embodiment of the present invention.
Figure 10B:
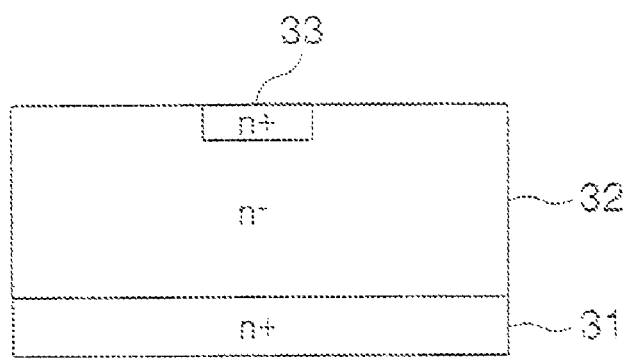

In the high-resistance layer formation step (step S21), a SiC layer 32 obtained by doping the layer with nitrogen having a thickness of 10 μm and a concentration of $1\times10^{16}$ cm$^{-3}$ as an impurity is formed by epitaxial growth on the SiC (silicon carbide) high-concentration n-type substrate 31 (FIG. 10A). In the low-resistance layer formation step (step S22), a source layer 33, which is obtained by doping the layer with nitrogen having a thickness of 0.2 to 0.4 μm and a concentration of 1 to $5\times10^{19}$ cm$^{-3}$ as an impurity, is then formed by ion implantation on the SiC layer 32 (FIG. 10B).

Figure 10C:
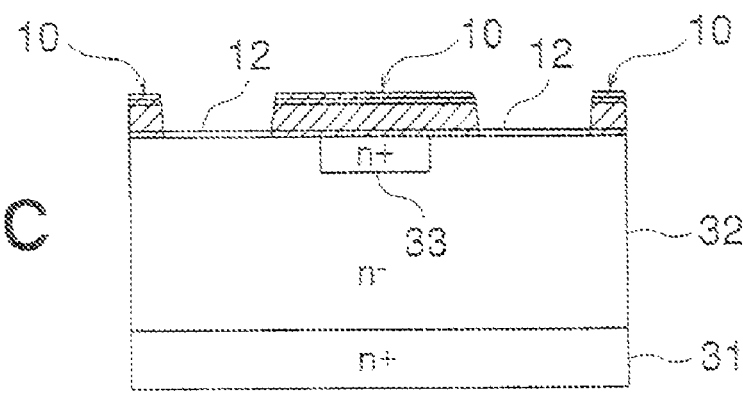

Next, in the gate region formation step (step S23), a p-type gate region is formed by selective ion implantation. In FIG. 10C, first, the ion implantation mask 10 of the present invention is formed on the surface to protect the regions in which the gate region is not formed. The numerical symbol 12 in FIGS. 10C and 10D denotes a silicon oxide film.

Figure 10D:
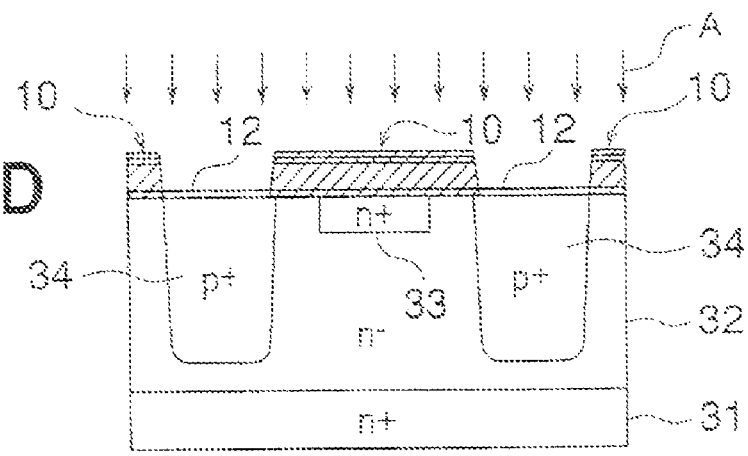

After the ion implantation mask 10 is formed, high-energy ion implantation is conducted (arrows A) to form the gate region 34 (FIG. 10D).

Figure 10E:
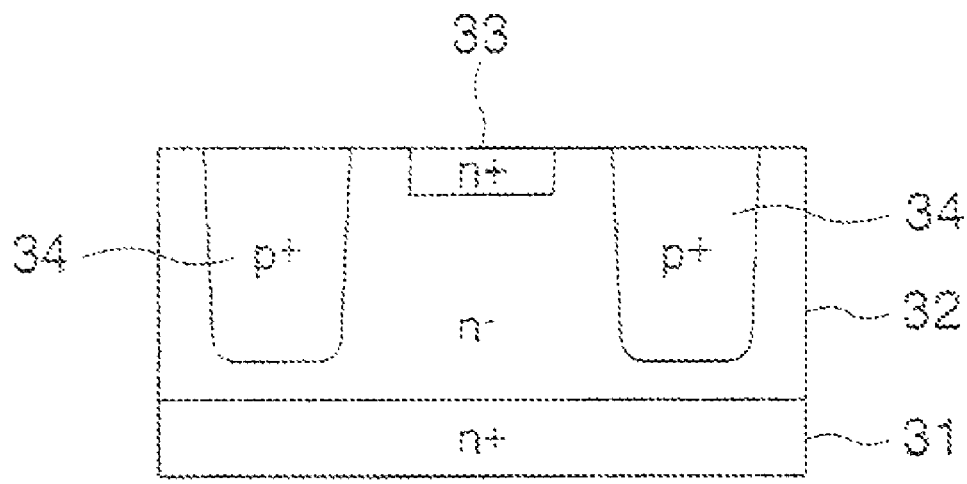

After ion implantation, the ion implantation mask 10 is removed by etching (FIG. 10E).

After ion implantation, the implanted ions are electrically activated in the semiconductor, and an activation heat-treatment is performed to remove crystallization defects that have formed during ion implantation. For example, a heat-treatment is performed for about 10 minutes at a high temperature of about 1700 to 1800° C. by using a high-frequency heat-treatment furnace or the like. Argon is used for the ambient gas.

Figure 10F:
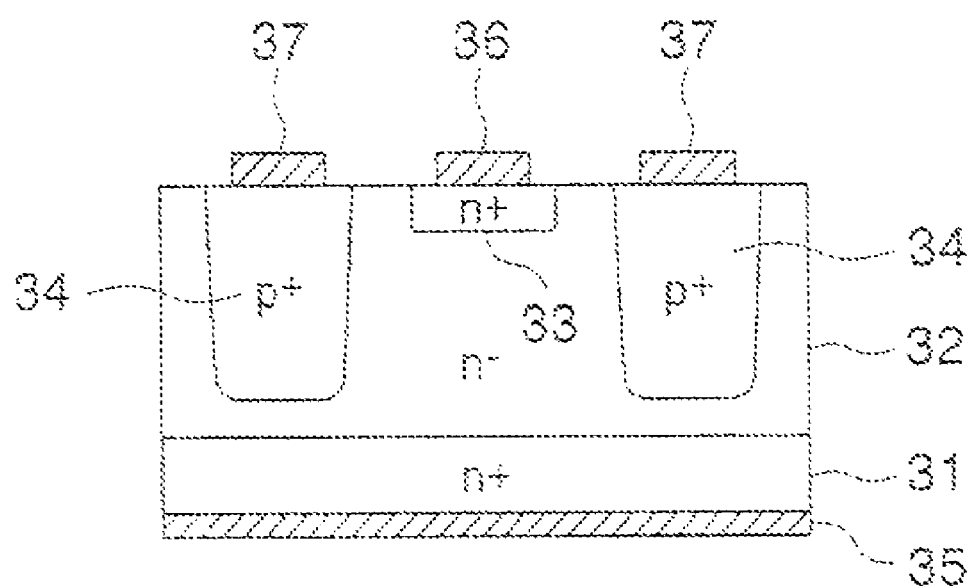
Figure 12:
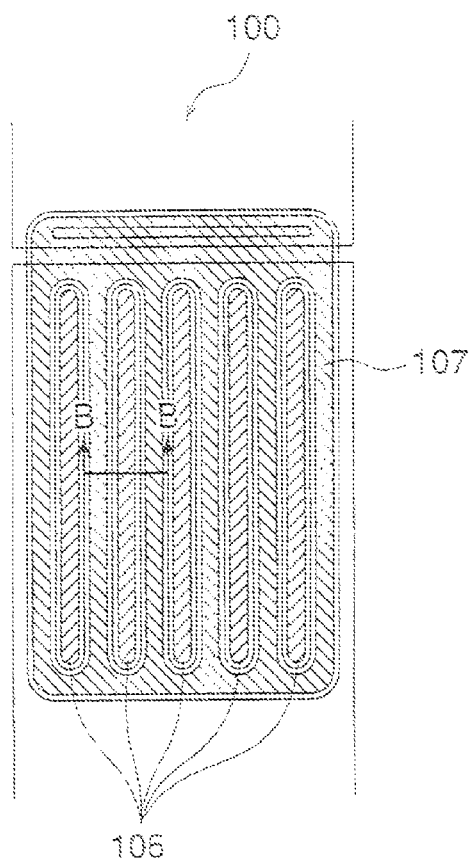
FIG. 12 is a plan view of a conventional junction field-effect transistor.
Figure 13:
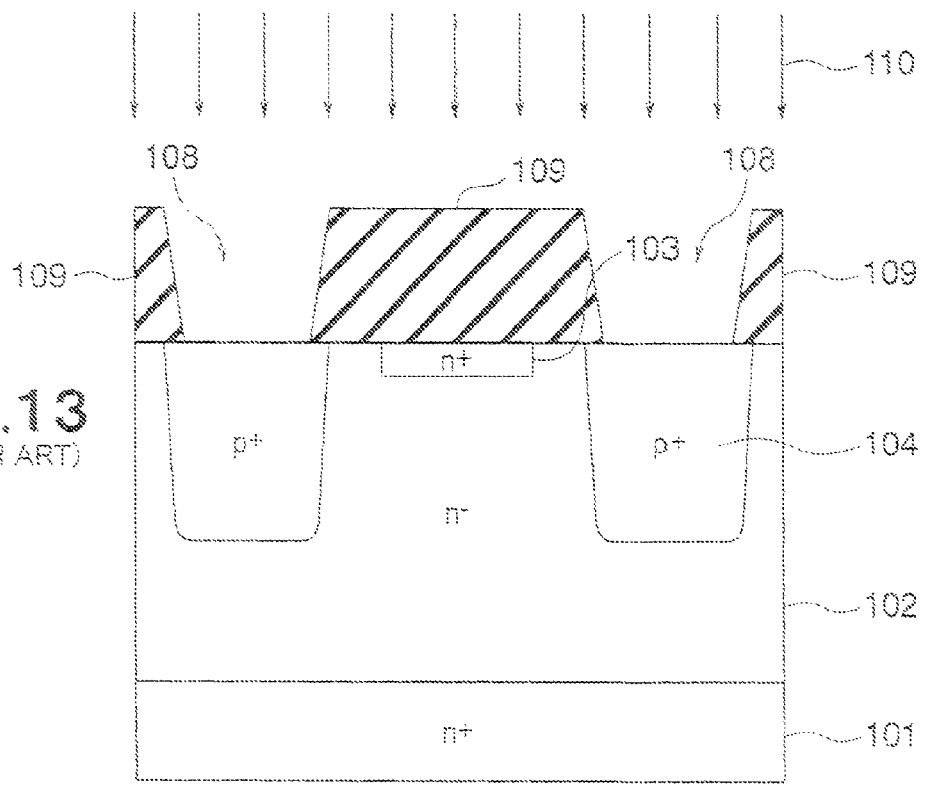
FIG. 13 is a cross-sectional view of a junction field-effect transistor at a stage in which a gate region is formed by ion implantation.

Then, the source electrodes 36, the gate electrode 37, and the drain electrode 35 are formed (FIG. 10F). Nickel or titanium is used for the source electrodes 36 and the drain electrode 35, and titanium or aluminum or the like is used for the gate electrode 37. The electrodes are formed by vapor deposition or by sputtering. Dry etching, wet etching, lift-off, or another method is used together with photolithography to form the pattern. After the electrodes are formed, a heat-treatment is performed to reduce contact resistance between the metal and the semiconductor. The heat-treatment is performed for about 10 to 30 minutes at 800 to 1000° C.

An upper layer wiring step is finally performed to incorporate the separated sources into one electrode. For example, after a CVD oxide film or the like is formed as an interlayer film, the CVD oxide film on the source electrodes 36 is removed by photolithography and etching, and an upper layer electrode is then deposited. Aluminum is used as the electrode material.

A highly functional silicon carbide semiconductor device 30 having normally-off characteristics as shown in FIG. 7 can thus be manufactured. The thicknesses of the layers, the amount of ion implantation energy, and other specific numeric values given in the present embodiment are merely examples and can be suitably varied within a range in which the present invention can be implemented.

In the present embodiment, molybdenum was used as the ion-inhibiting layer 14, but tungsten can also be used. Silicon oxide was used for the first oxide film 12 and the second oxide film 16, but the first oxide film 12 and the second oxide film 16 are not limited to this material alone and may be formed from oxide films other than silicon oxide films. A silicon nitride film or another nitride film besides silicon nitride may also be used in place of the first oxide film 12 and second oxide film 16. At this time, normal semiconductor processes can be applied to the first thin metal film 13 and the second thin metal film 15 as described above, and it is also possible to use a material that forms a nitride more easily than the metal used in the ion-inhibiting layer 14 and that functions sufficiently as an adhesive layer. For example, a titanium thin film is preferred for the first thin metal film 13 and the second thin metal film 15.

In the ion implantation mask 10 of the present invention as shown in FIG. 1, the first oxide film 12, the first thin metal film 13, the ion-inhibiting layer 14, the second thin metal film 15, and the second oxide film 16 are all configured from a single layer, but these films may be formed in multiple layers in combination with other materials as long as these films fulfill the same functions. For example, the first thin metal film 13, which is an adhesive layer, may have a multilayered structure that includes titanium or the like.

The present invention can be employed as an ion implantation mask that is used when a gate region or another selectively electroconductive region is formed on a semiconductor substrate by ion implantation; as a method for manufacturing this ion implantation mask; as a method for manufacturing a silicon carbide semiconductor device; and as a silicon carbide semiconductor device that is manufactured using this manufacturing method.

Obviously, various minor changes and modifications of the present invention are possible in light of the above teaching. It is therefore to be understood that within the scope of the appended claims the invention may be practiced otherwise than as specifically described.

What is claimed is:

1. A method for manufacturing an ion implantation mask, comprising:
    forming an oxide film as a protective film over an entire surface of a semiconductor substrate;
    forming a thin metal film over the oxide film; and
    forming an ion-inhibiting layer composed of an ion-inhibiting metal over the thin metal film,
    the thin metal film being formed between the oxide film and the ion-inhibiting layer and bonding the oxide film and the ion-inhibiting layer bonded together.

2. The method of claim 1, wherein
    the thin metal film oxidizes more easily than the ion-inhibiting metal used in the ion-inhibiting layer.

3. The method of claim 1, wherein
    the oxide film is a silicon oxide film;
    the thin metal film is a thin film obtained using at least one element selected from the group consisting of titanium, zirconium, vanadium, niobium, hafnium, and chromium; and
    the ion-inhibiting metal used in the ion-inhibiting layer is molybdenum or tungsten.

4. The method of using an ion implantation mask manufactured by the method of claim 1, for manufacturing a silicon carbide semiconductor device, comprising:
    forming a first electroconductive high-resistance layer on a silicon carbide semiconductor substrate, which is a first electroconductive low-resistance layer;
    forming a first electroconductive low-resistance layer that constitutes source regions;
    forming a gate region, which is a second electro-conductive low-resistance layer formed by ion implantation; and forming source electrodes, a gate electrode, and a drain electrode.

5. A method for manufacturing an ion implantation mask, comprising:

forming a nitride film as a protective film over an entire surface of a semiconductor substrate;

forming a thin metal film over the nitride film; and forming an ion-inhibiting layer composed of an ion-inhibiting metal over the thin metal film, the thin metal film being formed between the nitride film and the ion-inhibiting layer and bonding the nitride film and the ion-inhibiting layer bonded together.

6. The method of claim 5, wherein the thin metal film forms a nitride more easily than the ion-inhibiting metal used in the ion-inhibiting layer.

7. The method of claim 5, wherein the nitride film is a silicon nitride film;

the thin metal film is a thin film obtained using at least one element selected from the group consisting of titanium, zirconium, vanadium, niobium, hafnium, and chromium; and the ion-inhibiting metal used in the ion-inhibiting layer is molybdenum or tungsten.

8. The method of using an ion implantation mask manufactured by the method of claim 5 for manufacturing a silicon carbide semiconductor device, comprising:

forming a first electroconductive high-resistance layer on a silicon carbide semiconductor substrate, which is a first electroconductive low-resistance layer;

forming a first electroconductive low-resistance layer that constitutes source regions;

forming a gate region, which is a second electro-conductive low-resistance layer formed by ion implantation; and forming source electrodes, a gate electrode, and a drain electrode.

* * * * *